United States Patent
Kim et al.

(10) Patent No.: US 8,941,520 B2
(45) Date of Patent: Jan. 27, 2015

(54) RESISTOR-BASED Σ-ΔDAC

(75) Inventors: Hyung Seok Kim, Portland, OR (US); Yee W. Li, Beaverton, OR (US); Ashoke Ravi, Hillsboro, OR (US); Hasnain Lakdawala, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,156

(22) PCT Filed: Sep. 30, 2011

(86) PCT No.: PCT/US2011/054297
§ 371 (c)(1),
(2), (4) Date: Jun. 17, 2013

(87) PCT Pub. No.: WO2013/048450
PCT Pub. Date: Apr. 4, 2013

(65) Prior Publication Data
US 2013/0271305 A1    Oct. 17, 2013

(51) Int. Cl.
*H03M 3/00*    (2006.01)
*H03M 1/08*    (2006.01)
(Continued)

(52) U.S. Cl.
CPC ............. *H03M 3/50* (2013.01); *H03M 1/747* (2013.01); *H03M 1/00* (2013.01); *H03M 1/12* (2013.01);
(Continued)

(58) Field of Classification Search
CPC ......... H03M 3/30; H03M 1/747; H03M 1/00; H03M 1/12; H03M 1/785; G09G 3/3688

USPC ......... 341/143, 138, 139, 144, 145, 154, 155; 345/204
See application file for complete search history.

(56) References Cited

U.S. PATENT DOCUMENTS 3,906,489 A    9/1975    Schlichte
4,603,319 A *  7/1986    Hinn .............................. 345/204
(Continued)

FOREIGN PATENT DOCUMENTS

WO    2013/048450 A1    4/2013

OTHER PUBLICATIONS

International Search Report and Written opinion for PCT Patent Application No. PCT/US2011/054297, mailed on May 4, 2012, 8 Pages.

(Continued)

*Primary Examiner* — Joseph Lauture
(74) *Attorney, Agent, or Firm* — Cool Patent, P.C.

(57) ABSTRACT

An inverter-driven resistor-ladder digital-to-analog (DAC) converter includes a resistor-ladder network that comprises a resistor for each bit signal of a multi-bit input signal. Each resistor of the resistor-ladder network comprises an input end and an output end. The input end of each resistor is coupled to a corresponding bit signal of the multi-bit input signal, and the output end of each resistor is coupled to an output node of the resistor-ladder network. An output voltage is generated at the output node that is based on the multi-bit input signal. In one exemplary embodiment, the multi-bit input signal is a sigma-delta (ΣΔ) modulated multi-bit input signal. In another exemplary embodiment, resistance values of the resistors of the resistor-ladder network are related by a binary weighting. In still another exemplary embodiment, resistance values of the resistors of the resistor-ladder network are substantially equal.

22 Claims, 7 Drawing Sheets

(51) Int. Cl.
*H03M 1/80* (2006.01)
*H03M 1/78* (2006.01)
*H03M 1/74* (2006.01)
*H03M 1/00* (2006.01)
*H03M 1/12* (2006.01)
*G09G 3/36* (2006.01)

(52) U.S. Cl.
CPC ............... *H03M 3/30* (2013.01); *G09G 3/3688* (2013.01); *H03M 1/0863* (2013.01); *H03M 1/808* (2013.01); *H03M 3/502* (2013.01); *H03M 1/785* (2013.01)
USPC .......................................... 341/143; 341/144

(56) References Cited

U.S. PATENT DOCUMENTS

| | | | |
|---|---|---|---|
| 5,021,785 A * | 6/1991 | Kohdaka et al. | 341/138 |
| 5,231,395 A | 7/1993 | Irwin et al. | |
| 6,204,789 B1 | 3/2001 | Nagata | |
| 2002/0080053 A1 | 6/2002 | Brooks et al. | |
| 2005/0073453 A1 | 4/2005 | Cheng et al. | |

OTHER PUBLICATIONS

International Preliminary Report on Patentability and Written Opinion received for PCT Patent Application No. PCT/US2011/054297, mailed on Apr. 10, 2014, 5 pages.

* cited by examiner

US 8,941,520 B2

RESISTOR-BASED Σ-ΔDAC

BACKGROUND

Conventional current-steering techniques have been widely used for high-speed sigma-delta Digital-to-Analog converters (ΣΔ DAC) for deep sub-micron technologies. To meet linearity requirements, unit current cells should be well matched, which requires a large silicon area. Accordingly, transistor matching is becoming more difficult and "area expensive" as processes scale smaller (<22 nm). Alternatively, dynamic element matching or self-current calibration techniques have been conventionally used to compensate for mismatches between unit current DAC cells. These alternative techniques, however, also occupy extra silicon area, while limiting the maximum DAC operation speed. Accordingly, conventional current-steering architectures presently used for DACs are not area-efficient.

DESCRIPTION OF THE DRAWING FIGURES

Claimed subject matter is particularly pointed out and distinctly claimed in the concluding portion of the specification. Such subject matter may, however, be understood by reference to the following detailed description when read with the accompanying drawings in which:

Figure 1:
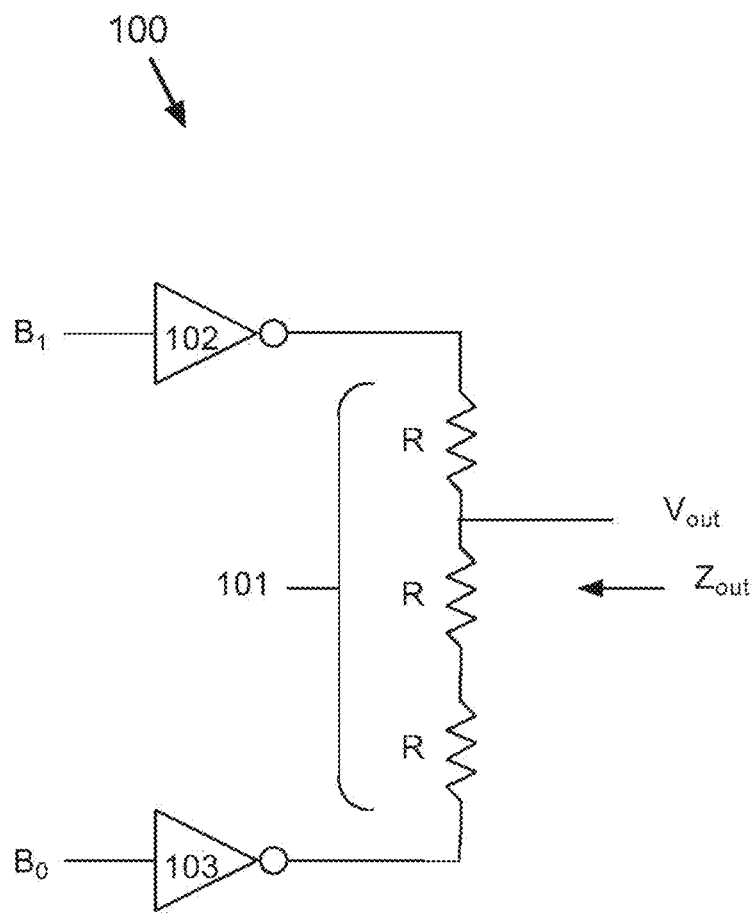
FIG. 1 depicts a schematic block diagram of an exemplary embodiment of an inverter-driven-resistor DAC according to the subject matter disclosed herein.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. It will, however, be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. "Coupled" may mean that two or more elements are in direct physical and/or electrical contact. "Coupled" may, however, also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. "Over" may, however, also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other. As used herein, the word "exemplary" means "serving as an example, instance, or illustration." Any embodiment described herein as "exemplary" is not to be construed as necessarily preferred or advantageous over other embodiments.

The subject matter disclosed herein relates to a digital-to-analog converter (DAC) technology that does not rely on matched current sources for accuracy, but instead utilizes closely matched resistance values for output accuracy. In that regard, the subject matter disclosed herein provides a scaling-compatible DAC architecture. Modern processes (<22 nm) are capable of fabricating for metal gates compact resistors having well-matched resistance values. Accordingly, the same technique to fabricate metal gates can be utilized for fabricating highly linear DACs that comprise a small area and without the flicker noise associated with transistors. Because the effective area of gate resistance is expected to increase with future transistor types, such as tri-gate transistors, the DAC technology disclosed herein would be more area efficient than conventional DAC techniques. Additionally, a one-pole low-pass filter (LPF) can be embedded in the configuration of a DAC according to the subject matter disclosed herein by adding a single capacitor to the output node. Further, a simple slope-control scheme can be included for eliminating even-order harmonics and noise folding caused by duty-cycle distortion for single-ended DAC implementation.

FIG. 1 depicts a schematic block diagram of an exemplary embodiment of an inverter-driven-resistor DAC 100 according to the subject matter disclosed herein. Inverter-driven DAC 100 comprises a resistor ladder 101 formed by three gate resistance R and two inverters 102 and 103 that are respectively coupled to opposite ends of resistor ladder 101. Although the term "gate resistance" is used herein, it should be understood that the subject matter disclosed herein is not limited to gate metal resistances, but can be used with any resistance. Inverters 102 and 103 respectively drive the top and bottom of resistor ladder 101 with a binary code $B_1B_0$, thereby forming a two-bit DAC. DAC 100 provides four outputs based on binary code $B_1B_0$. That is, the output of DAC 100 is $$V_{DD} \times (R \times MSB \times 2^1 + 2R \times LSB \times 2^0)/3R, \qquad (1)$$

yielding an output of 0, $\tfrac{1}{3}V_{DD}$, $\tfrac{2}{3}V_{DD}$ and $V_{DD}$, in which $V_{DD}$ is the supply voltage of the inverters 102 and 103.

The topology of DAC 100 provides constant output impedance $Z_{out}$, which in the exemplary configuration depicted in FIG. 1 is 2R/3, and therefore can be used for a high-speed DAC. By adding a single capacitor to the output at $V_{out}$, a first-order low-pass filter (LPF) can be implemented that suppresses high-frequency quantization noise generated by sigma-delta modulation (ΣΔ MOD). Additionally, use of the resistor ladder as part of the LPF saves silicon area.

Figure 2:
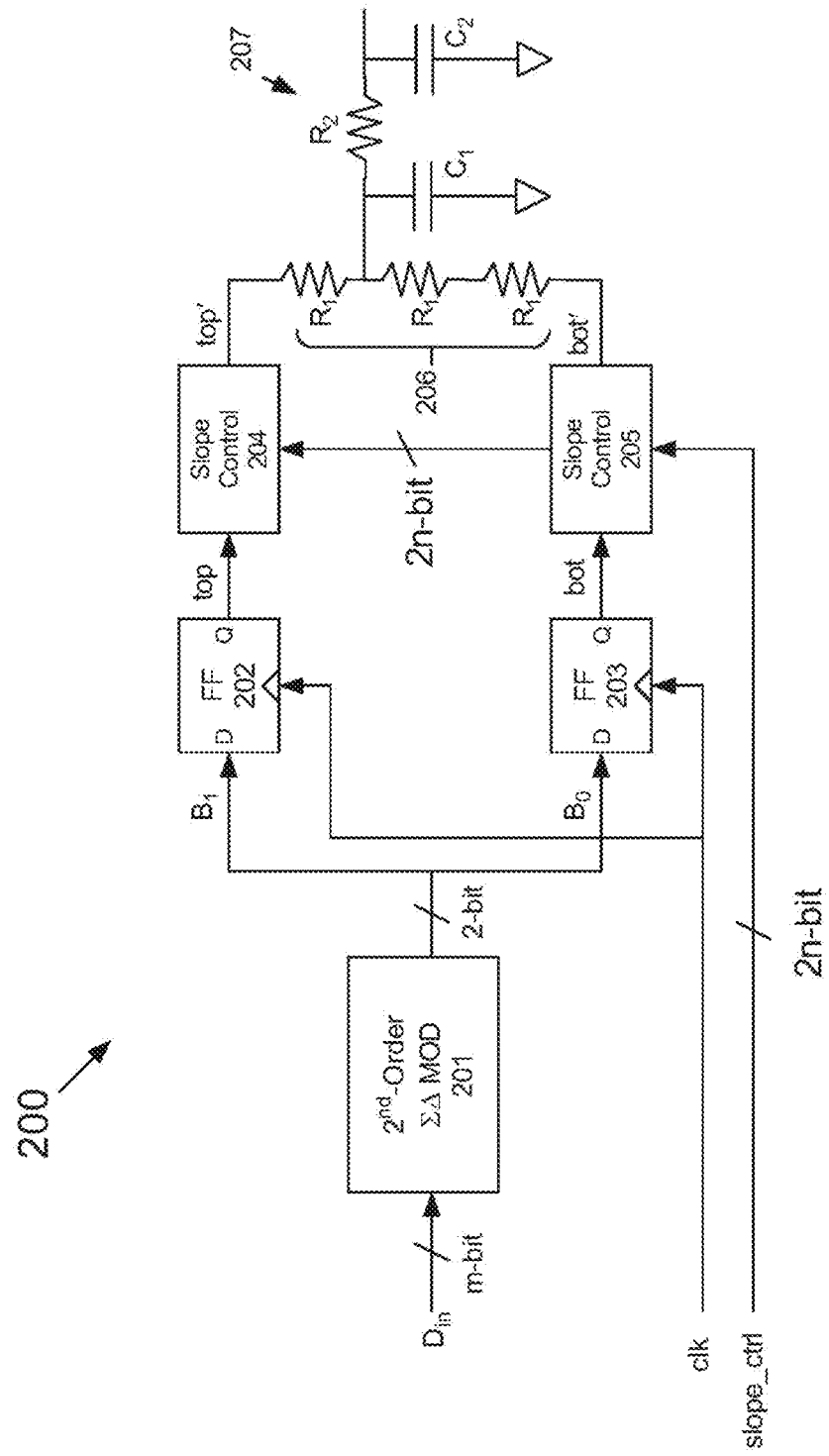
FIG. 2 depicts a schematic block diagram of a second exemplary embodiment of a resistor-based ΣΔ DAC according to the subject matter disclosed herein.

FIG. 2 depicts a schematic block diagram of a second exemplary embodiment of a resistor-based ΣΔ DAC 200 according to the subject matter disclosed herein. DAC 200 comprises a $2^{nd}$-order EA modulator 201, flip-flops (FF) 202 and 203, slope-control blocks 204 and 205, resistor ladder 206 and an RC π-network 207, which comprises capacitors $C_1$ and $C_2$ and resistor $R_2$. ΣΔ modulator 201 operates in a well-known manner to generate a 2-bit digital output from m-bit input data $D_{in}$. For details regarding the operation of ΣΔ modulators, see, for example, P. M. Aziz et al., "An overview of sigma-delta converters," IEEE Signal Processing Magazine, Vol. 13, January 1996, pp. 61-84, which is incorporated by reference herein. The 2-bit digital output includes noise-shaped (high-pass) quantization noise that is suppressed by a $2^{nd}$-order passive LPF that is implemented by resistor ladder 206 and π-network 207.

Flip-flops 202 and 203 ensure that bits $B_1$ and $B_0$ are synchronized with a DAC clock clk. There could be, however, a mismatch between the clock-to-Q-delay, when the FF output transitions from low to high, and vice versa. This mismatch creates a duty-cycle distortion resulting in even-order harmonics plus a high-frequency noise folding. A fully differential implementation of resistor-based ΣΔ DAC 200 can eliminate the duty-cycle distortion problem, but when a single-ended DAC configuration is necessary, a calibration scheme is required. For example, the code-dependent clock-to-Q-delay mismatch can be calibrated by separately controlling rising and falling time of the outputs of FFs 202 and 203. Slope-control logic 204 and 205 can be implemented by a digitally controlled current-starved inverter, as shown in FIG. 3.

Figure 3:
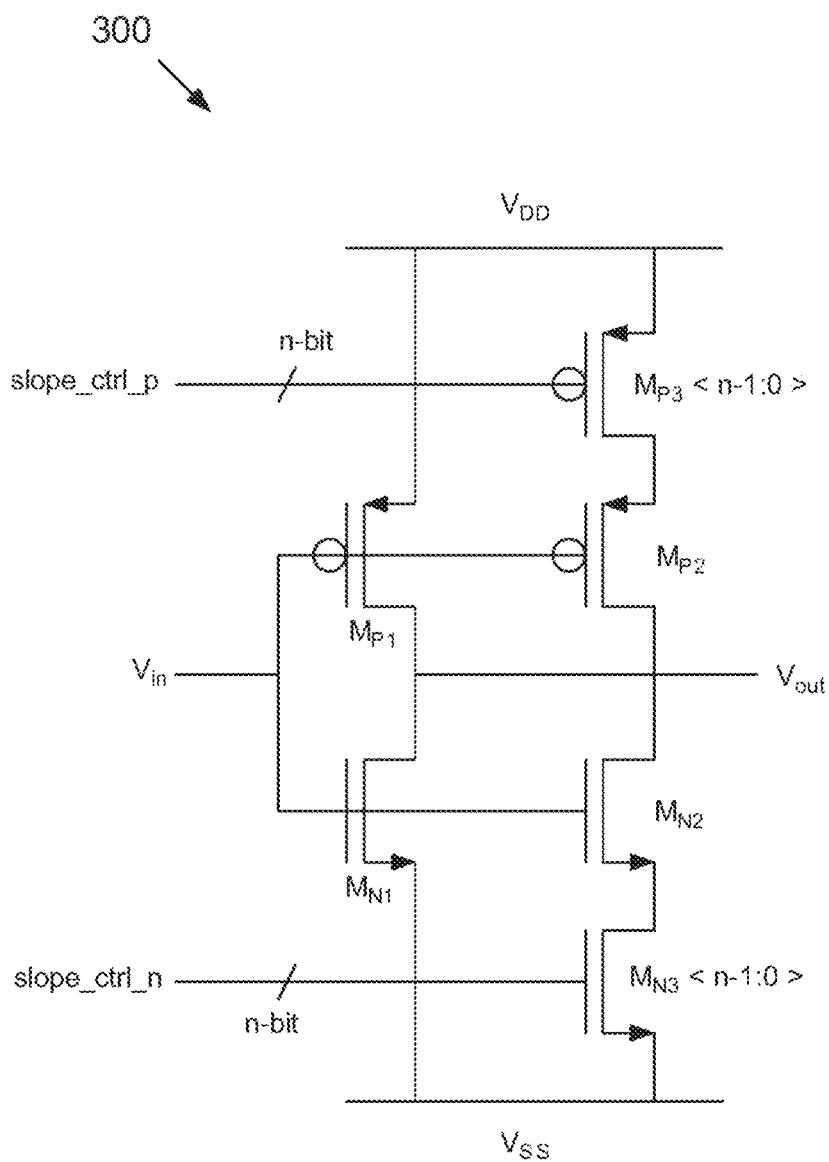
FIG. 3 depicts a schematic diagram of an exemplary embodiment of a digitally controlled current-starved inverter according to the subject matter disclosed herein.

FIG. 3 depicts a schematic diagram of an exemplary embodiment of a digitally controlled current-starved inverter 300 according to the subject matter disclosed herein. Inverter 300 comprises to push-pull transistor arrangements coupled in parallel between power supplies $V_{DD}$ and $V_{SS}$. MOSFET transistors $M_{P1}$ and $M_{N1}$ form the first push-pull arrangement, and MOSFET transistors $M_{P2}$, $M_{P3}<n-1:0>$, $M_{N2}$ and $M_{N3}<n-1:0>$ for the second push-pull arrangement. $M_{P3}<n-1:0>$ and $M_{N3}<n-1:0>$ represent n instances of $M_{P3}$ and $M_{N3}$ in parallel, respectively. Input $V_{in}$ (from FF 202 or 203 in FIG. 2) is coupled to the respective gates of transistors $M_{P1}$, $M_{N1}$, $M_{P2}$, and $M_{N2}$, and the output $V_{out}$ is taken from the common connection of the respective drains of transistors $M_{P1}$, $M_{N1}$, $M_{P2}$, and $M_{N2}$. Output Vout corresponds to signal top' or bot' (FIG. 2) and is coupled to resistor ladder 206 (FIG. 2). The gates of transistors $M_{P3}<n-1:0>$ and $M_{N3}<n-1:0>$ are coupled to the n-bit slope_ctrl_p and slope_ctrl_n. By turning on and off the transistors $M_{P3}<n-1:0>$ and $M_{N3}<n-1:0>$, amount of current of the second push-pull arrangement can be controlled and thus rising and falling time slope of the output $V_{out}$ can be controlled to cancel out the duty-cycle distortion. The slope control adjusts the drive strength (i.e., the current) of the inverter by controlling the number of transistors acting in parallel. By increasing the drive strength, the slope can be increased (faster low-high or high-low transitions) and, conversely, by decreasing the drive strength, the slope can be decreased (slower transitions).

Figure 4:
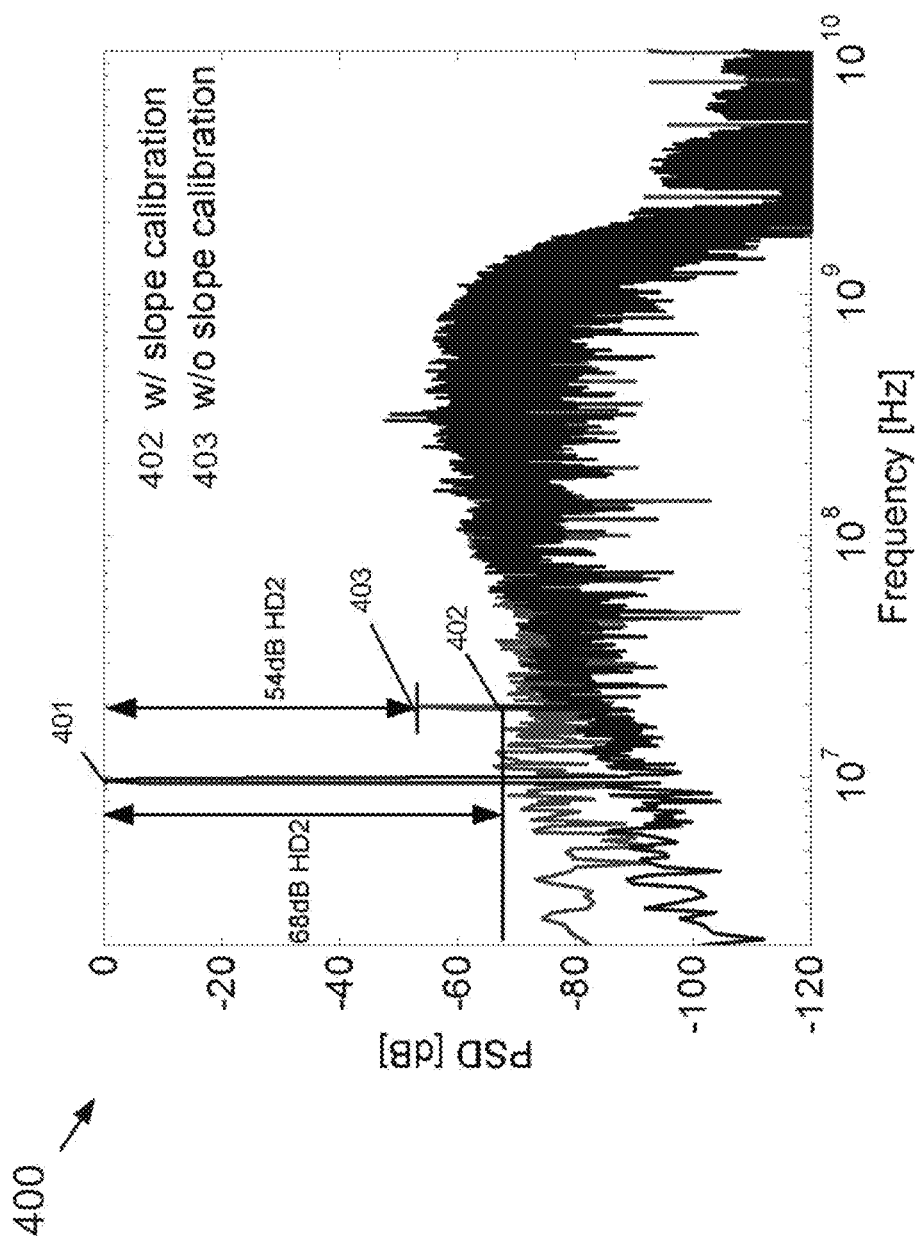
FIG. 4 shows a graph of an post layout simulation result comparing performance of a calibrated and an uncalibrated ΣΔ DAC according to the subject matter disclosed herein

FIG. 4 shows a Graph 400 of an post layout simulation result comparing performance of a calibrated and an uncalibrated ΣΔ DAC according to the subject matter disclosed herein. The abscissa for graph 400 is frequency measured in Hertz, and the ordinate for graph 400 is power spectrum density (PSD) in dB. For the simulation, the DAC was operated at 2.5 GHz and its output was oversampled by a factor of 8 (at 401 in Graph 400). With slope calibration, the second harmonic (HD2) is attenuated by 68 dB HD2 (at 402), which is a 14 dB improvement compared to operation without slope calibration (at 403).

Figure 5A:
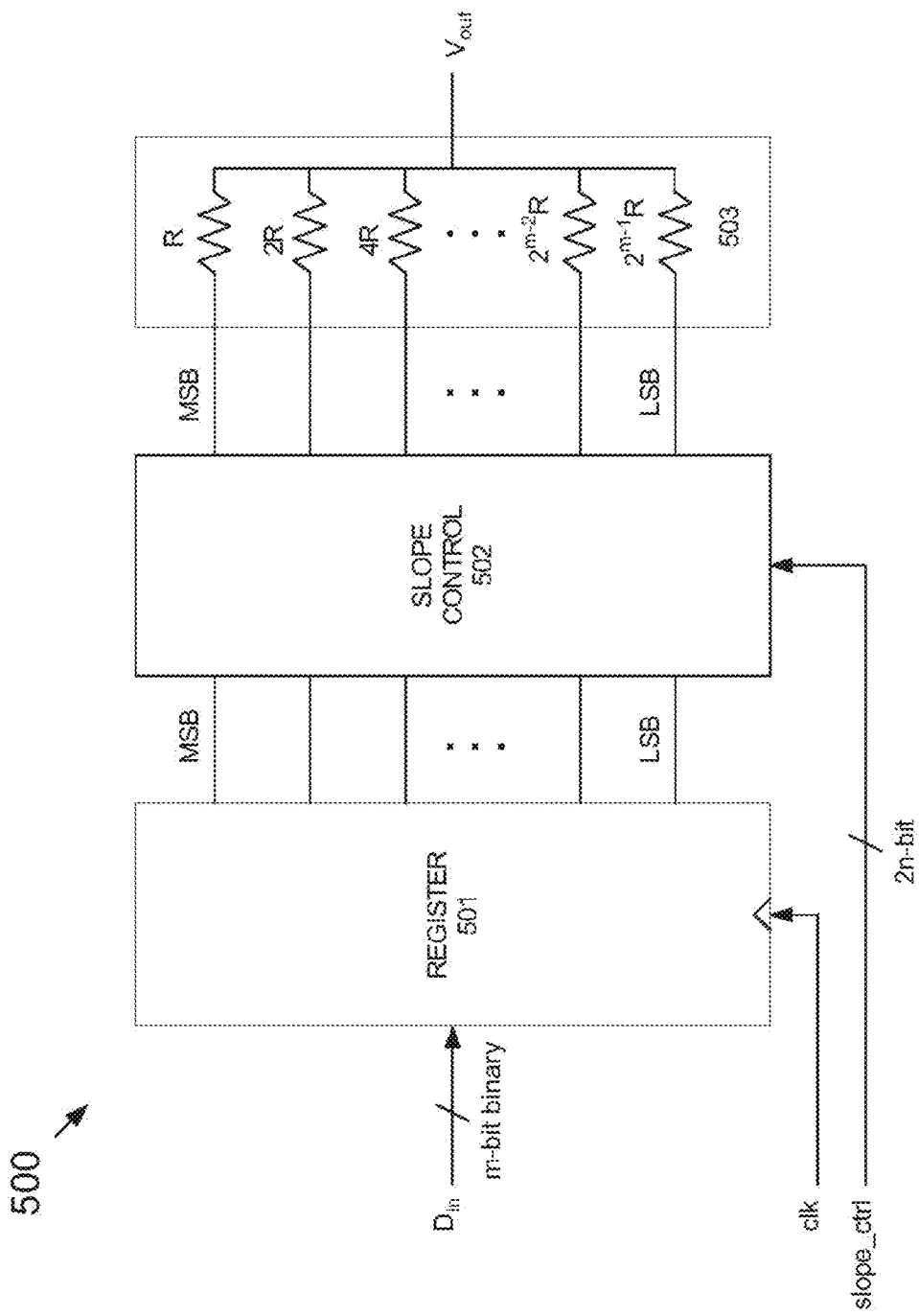
FIG. 5A depicts a schematic block diagram of an exemplary embodiment for a binary multi-bit ΣΔ DAC according to the subject matter disclosed herein.
Figure 5B:
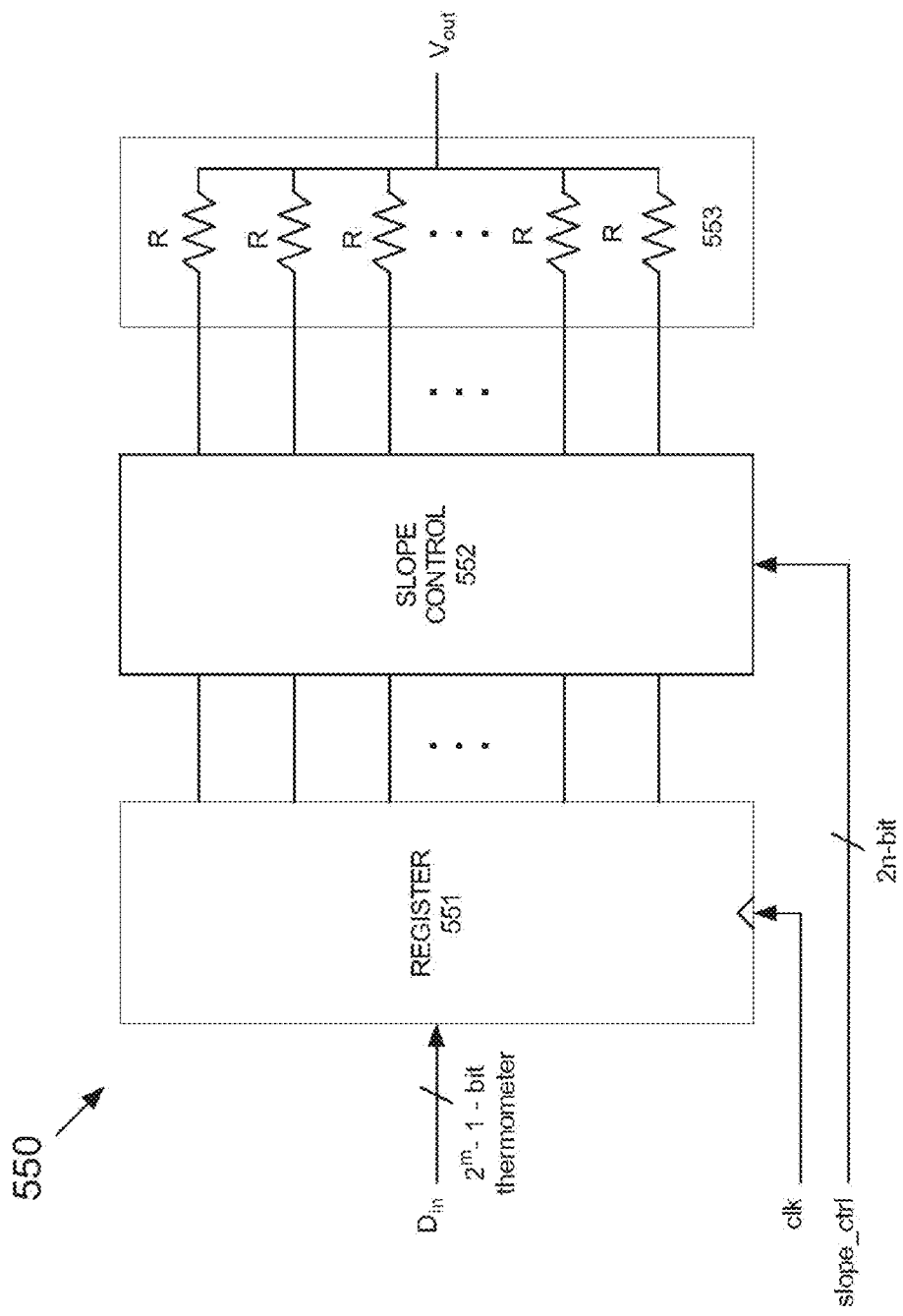
FIG. 5B depicts a schematic block diagram of an exemplary embodiment for a thermometric multi-bit ΣΔ DAC according to the subject matter disclosed herein.

The ΣΔ DAC according to the subject matter disclosed herein can be extended to multi-bit (i.e., more than 2-bit) design by parallelization. FIG. 5A depicts a schematic block diagram of an exemplary embodiment for a binary multi-bit ΣΔ DAC 500 according to the subject matter disclosed herein. Binary multi-bit ΣΔ DAC 500 can be implemented by adding binary-weighted resistors in parallel in the resistor ladder. FIG. 5B depicts a schematic block diagram of an exemplary embodiment for a thermometric multi-bit ΣΔ DAC 550 according to the subject matter disclosed herein. Thermometric multi-bit ΣΔ DAC 550 can be implemented by adding uniformly weighted resistors (i.e., all resistors substantially equal) in parallel in the resistor ladder.

Binary multi-bit ΣΔ DAC 500, depicted in FIG. 5A, comprises a multi-bit register 501 coupled to a slope control 502. The output of slope control 502 is coupled to a resistor ladder 503 that comprises binary-weighted resistors (R through $2^{m-1}R$) in connected in parallel. The bits of an m-bit binary input signal $D_{in}$ are output from a ΣΔ modulator (not shown) and are synchronized by a DAC clock clk. Slope control 502 receives a 2n-bit input slope_ctrl signal that controls the slope of output signal $V_{out}$. The binary-weighed values of the resistors of resistor ladder 503 provide a binary-based output signal $V_{out}$.

The thermometric multi ΣΔ DAC 550, depicted in FIG. 5B, similarly comprises a multi-bit register 551 coupled to a slope control 552. The output of slope control 552 is coupled to resistor ladder 553 that comprises uniformly weighted resistors in parallel. The bits of a $2^m-1$ thermometric input signal $D_{in}$ are output from a ΣΔ modulator (not shown) and are synchronized by a DAC clock clk. Slope control 552 receives a 2n-bit input slope_ctrl signal that controls the slope of output signal $V_{out}$. The uniformly weighted values of resistors of resistor ladder 553 provide a thermometric output signal.

Figure 6:
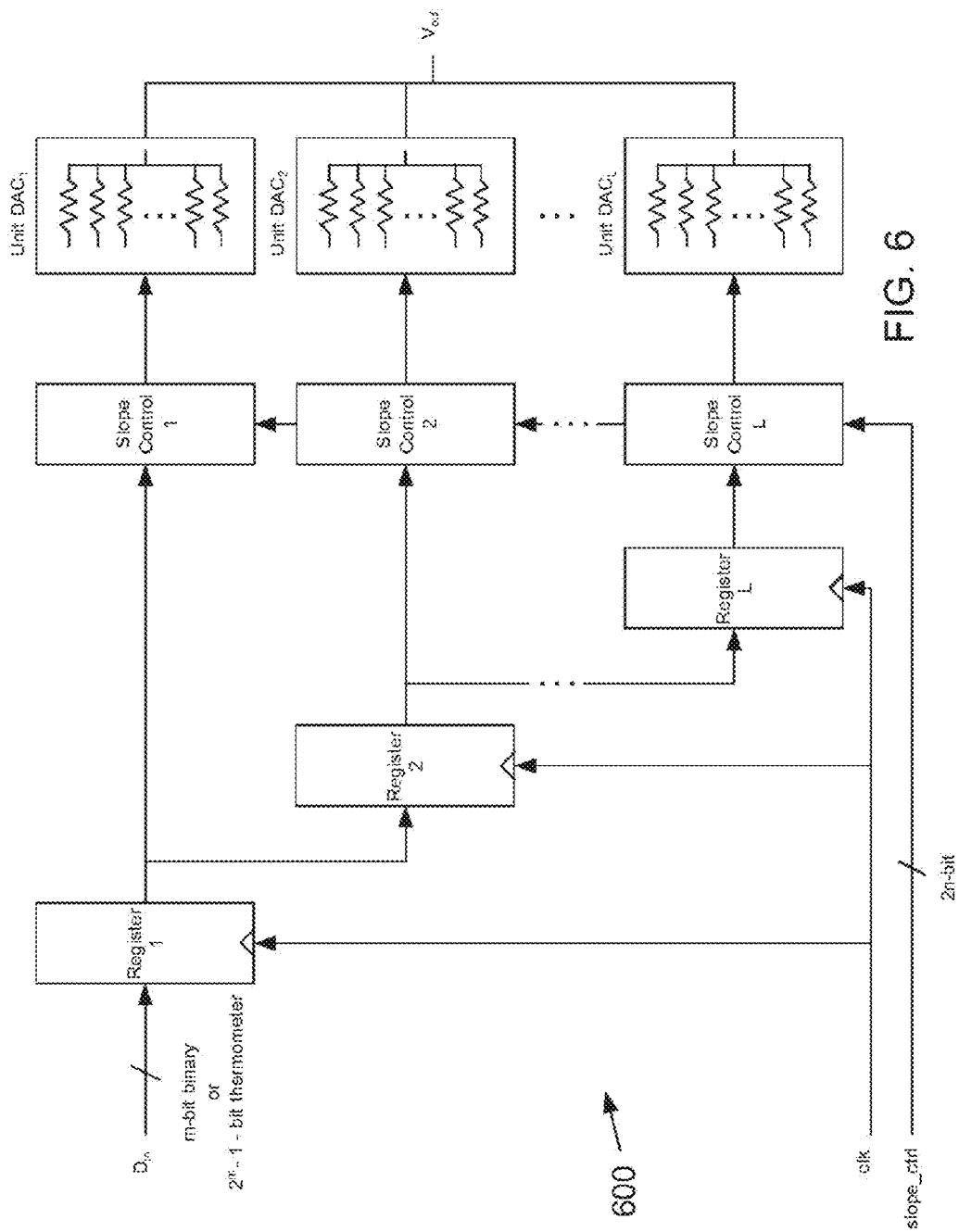
FIG. 6 depicts a schematic block diagram of an exemplary embodiment of a parallelized configuration of a plurality of DAC units according to the subject matter disclosed herein.

Filtering performance of a ΣΔ DAC according to the subject matter disclosed herein can be improved by a semi-digital operation, such as, by parallelizing a plurality of L unit DACs using L-1-stage registers, as depicted by ΣΔ DAC 600 in FIG. 6. The output of each Register 1 through Register L-1 is respectively connected to the input of the next stage Register 2 through Register L. A given input signal Din advances through Registers 1-L as the DAC clk signal advances. Each Slope Control 1 through Slope Control L operates similarly to Slope Control 300 depicted in FIG. 3. For the exemplary embodiment of ΣΔ DAC 600 depicted in FIG. 6, either a binary or thermometric DAC can be embodied. In another exemplary embodiment, an L-tap Finite Impulse Response (FIR) filtering performance can be implemented with the FIR filter coefficients realized through the resistance value of each unit DAC.

Although the claimed subject matter has been described with a certain degree of particularity, it should be recognized that elements thereof may be altered by persons skilled in the art without departing from the spirit and/or scope of claimed subject matter. The claimed subject matter will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A digital-to-analog converter, comprising an inverter-driven resistor-ladder network comprising a resistor for each bit signal of a multi-bit input signal, the multi-bit input signal comprising a plurality of bits, each resistor of the resistor-ladder network comprising an input end and an output end, the input end of each resistor being coupled to a corresponding bit signal of the multi-bit input signal, and the output end of each resistor being coupled to an output node of the resistor-ladder network, the digital-to-analog converter to generate an output voltage at the output node being based on the multi-bit input signal;
   wherein the multi-bit input signal is a sigma-delta (ΣΔ) modulated multi-bit input signal and wherein the multi-bit input signal further comprises a slope-controlled ΣΔ modulated multi-bit input signal.

2. The digital-to-analog converter according to claim 1, wherein resistance values of the resistors of the resistor-ladder network are related by a binary weighting.

3. The digital-to-analog converter according to claim 1, wherein resistance values of the resistors of the resistor-ladder network are substantially equal.

4. The digital-to-analog converter according to claim 1, further comprising a register, the register to receive the multi-bit input signal and to output the received multi-bit input signal to the resistor-ladder network.

5. The digital-to-analog converter according to claim 1, further comprising:
   a plurality of registers, the registers being connected in a sequence with an input to a first register of the plurality of registers to receive the ΣΔ-modulated multi-bit input signal and an output of the first register to output the received ΣΔ-modulated multi-bit signal to an input of a next register of the sequence, a last register of the plurality of registers being not to output the received ΣΔ-modulated multi-bit signal to an input of a next register; and
   a plurality of resistor-ladder networks, each resistor-ladder network corresponding to one of the plurality of registers and each resistor-ladder network comprising a resistor for each bit signal of the ΣΔ-modulated multi-bit signal output by the corresponding register, each resistor of a resistor-ladder network comprising an input end and an output end, the input end of each resistor being coupled to the corresponding bit signal of the ΣΔ-modulated multi-bit signal output by the corresponding register, and the output end of each resistor being coupled to an output node of the resistor-ladder network, each output node of the plurality of resistor-ladder networks being coupled to an output node of the digital-to-analog converter, and the digital-to-analog converter to generate an output voltage at the output node of the digital-to-analog converter being based on the ΣΔ-modulated multi-bit input signal.

6. The digital-to-analog converter according to claim 1, wherein resistance values of the resistors of the resistor-ladder network are related by a binary weighting.

7. The digital-to-analog converter according to claim 1, wherein resistance values of the resistors of the resistor-ladder network are substantially equal.

8. A digital-to-analog converter, comprising:
   a sigma-delta (ΣΔ) modulator to output a ΣΔ-modulated multi-bit output signal, the ΣΔ-modulated multi-bit output signal comprising a plurality of bits;
   a resistor-ladder network comprising a resistor for each bit signal of the ΣΔ-modulated multi-bit output signal, each resistor of the resistor-ladder network comprising an input end and an output end, the input end of each resistor being coupled to a corresponding bit signal of the ΣΔ-modulated multi-bit output signal, and the output end of each resistor being coupled to an output node of the resistor-ladder network, the digital-to-analog converter generating an output voltage at the output node being based on the ΣΔ-modulated multi-bit output signal;
   a plurality of registers, the registers being connected in a sequence with an input to a first register of the plurality of registers to receive the ΣΔ-modulated multi-bit input signal and an output of the first register to output the received ΣΔ-modulated multi-bit signal to an input of a next register of the sequence, a last register of the plurality of registers being not to output the received ΣΔ-modulated multi-bit signal to an input of a next register; and
   a plurality of resistor-ladder networks, each resistor-ladder network corresponding to one of the plurality of registers and each resistor-ladder network comprising a resistor for each bit signal of the ΣΔ-modulated multi-bit signal output by the corresponding register, each resistor of a resistor-ladder network comprising an input end and an output end, the input end of each resistor being coupled to the corresponding bit signal of the ΣΔ-modulated multi-bit signal output by the corresponding register, and the output end of each resistor being coupled to an output node of the resistor-ladder network, each output node of the plurality of resistor-ladder networks being coupled to an output node of the digital-to-analog converter, and the digital-to-analog converter to generate an output voltage at the output node of the digital-to-analog converter being based on the ΣΔ-modulated multi-bit input signal.

9. The digital-to-analog converter according to claim 8, wherein resistance values of the resistors of the resistor-ladder network are related by a binary weighting.

10. The digital-to-analog converter according to claim 8, wherein resistance values of the resistors of the resistor-ladder network are substantially equal.

11. The digital-to-analog converter according to claim 8, further comprising a register, the register to receive the ΣΔ-modulated multi-bit output signal and to output the received ΣΔ-modulated multi-bit output signal to the resistor-ladder network.

12. The digital-to-analog converter according to claim 8, wherein resistance values of the resistors of the resistor-ladder network are related by a binary weighting.

13. The digital-to-analog converter according to claim 8, wherein resistance values of the resistors of the resistor-ladder network are substantially equal.

14. A method of generating an output signal for a digital-to-analog converter, the method comprising:
   receiving a multi-bit input signal at a resistor-ladder network, the multi-bit input signal comprising a plurality of bits, the resistor-ladder network comprising a resistor for each bit signal of the multi-bit input signal, each resistor of the resistor-ladder network comprising a metal gate transistor to provide a resistance of a respective resistor and having an input end and an output end, the input end of each resistor being coupled to a corresponding bit signal of the multi-bit input signal, and the output end of each resistor being coupled to an output node of the resistor-ladder network; and generating an output voltage at the output node of the resistor-ladder network based on the multi-bit input signal, the output voltage being an output signal of the digital-to-analog converter.

15. The method according to claim 14, wherein resistance values of the resistors of the resistor-ladder network are related by a binary weighting.

16. The method according to claim 14, wherein resistance values of the resistors of the resistor-ladder network are substantially equal.

17. The method according to claim 14, wherein the multi-bit input signal is a sigma-delta (IA) modulated multi-bit input signal.

18. A digital-to-analog converter, comprising:
a resistor ladder network comprising two or more resistors, wherein the resistors comprise metal-gate transistors to provide a respective resistance value for one or more of the resistors in the resistor ladder network;
a slope control circuit coupled to the resistor ladder network; and
a register to receive a multi-bit input and to provide the multi-bit input as an input provided to a respective inverter of the slope control circuit;
wherein the slope control circuit comprises two or more inverters, and at least one or more of the two or more inverters comprises a digitally-controlled current-starved inverter having a slope control input to control a rise time and a fall time of an input provided to a respective inverter.

19. A digital-to-analog converter as claimed in claim 18, further comprising a filter coupled to an output of the resistor ladder network to suppress quantization noise for an output of the digital-to-analog converter.

20. A digital-to-analog converter as claimed in claim 18, further comprising multiple resistor ladder networks and multiple slope control circuits coupled to multiple registers in parallel to provide FIR filtering for an output of the digital-to-analog converter.

21. A digital-to-analog converter as claimed in claim 18, wherein the resistors have binary weighted resistance values.

22. A digital-to-analog converter as claimed in claim 18, wherein the resistors have uniformly distributed resistance values.

* * * * *